US007232771B2

(12) United States Patent
Jacobs et al.

(10) Patent No.: US 7,232,771 B2

(45) Date of Patent: Jun. 19, 2007

(54) METHOD AND APPARATUS FOR DEPOSITING CHARGE AND/OR NANOPARTICLES

(75) Inventors: Heiko O. Jacobs, Minneapolis, MN (US); Chad Barry, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 0 days.

(21) Appl. No.: 10/982,179

(22) Filed: Nov. 4, 2004

(65) Prior Publication Data

US 2005/0123687 A1 Jun. 9, 2005

Related U.S. Application Data

(60) Provisional application No. 60/517,327, filed on Nov. 4, 2003.

(51) Int. Cl.
*H01L 21/31* (2006.01)
*H01L 21/469* (2006.01)

(52) U.S. Cl. ...................... 438/758; 977/901; 438/468; 257/E21.028

(58) Field of Classification Search ................ 438/758, 438/677, 468, 763; 257/E21.024, E21.476, 257/E21.576; 977/887, 901; 118/73, 212
See application file for complete search history.

(56) References Cited

U.S. PATENT DOCUMENTS 3,518,565 A 6/1970 Broekema et al. ............ 330/31
4,565,772 A 1/1986 Takeoka et al. ............ 430/320
4,735,143 A 4/1988 Weir .......................... 101/333
5,363,021 A 11/1994 MacDonald ................ 315/366
5,666,190 A 9/1997 Quate et al. .................. 355/71
6,096,386 A * 8/2000 Biebuyck et al. ........... 427/510
6,180,239 B1 1/2001 Whitesides et al. ...... 428/411.1
6,323,233 B1 11/2001 Wright et al. ............... 514/408
6,444,697 B2 9/2002 Wright et al. ............... 514/408
6,776,094 B1 8/2004 Whitesides et al. .......... 101/327
2001/0056112 A1 12/2001 Wright et al. ............... 514/414
2003/0102444 A1* 6/2003 Deppert et al. ........ 250/492.22
2003/0178316 A1 9/2003 Jacobs et al. ............... 205/157

(Continued)

FOREIGN PATENT DOCUMENTS

AU 0 171 799 A5 1/2002

(Continued)

OTHER PUBLICATIONS

"Approaching Nanoxerography: The Use of Electrostatic Forces to Position Nanoparticles with 100 nm Scale Resolution", by H. Jacobs et al., *Adv. Mater.*, vol. 14, No. 21, Nov. 4, 2002, pp. 1553-1557.

(Continued)

*Primary Examiner*—Caridad Everhart
(74) *Attorney, Agent, or Firm*—Westman, Champlin & Kelly, P.A.

(57) ABSTRACT

A method and apparatus for use in depositing electrical charge and/or nanoparticles is provided. A stamping process is used in which a stamp having a flexible layer such as a flexible semiconductor layer applies a charge pattern on a substrate. Other techniques include lithographic patterning, the use of pre-patterned dissimilar materials, deposition by ions or radiation, the use of differing work functions, the use of liquid phase materials. Deposition monitoring techniques and apparatuses are also provided.

25 Claims, 12 Drawing Sheets

U.S. PATENT DOCUMENTS

| | | | | |
|---|---|---|---|---|
| 2004/0033679 | A1* | 2/2004 | Jacobson et al. | 438/510 |
| 2004/0086709 | A1* | 5/2004 | Hammond Cunningham et al. | 428/335 |
| 2005/0118338 | A1* | 6/2005 | Stebe et al. | 427/331 |

FOREIGN PATENT DOCUMENTS

| | | | |
|---|---|---|---|
| DE | 1 265 240 | | 4/1968 |
| DE | 196 12 939 | A1 | 4/1996 |
| EP | 0 480 183 | A2 | 4/1992 |
| EP | 1 297 387 | | 1/2002 |
| WO | WO 98/27463 | | 6/1998 |
| WO | WO 01/84238 | A1 | 11/2001 |
| WO | WO 02/03142 | A2 | 1/2002 |
| WO | WO 02/003142 | A3 | 1/2002 |
| WO | WO 03/087590 | A2 | 10/2003 |
| WO | WO 03/087590 | A3 | 10/2003 |

OTHER PUBLICATIONS

News Report: “Nanoscale Photocopies”, by P. Ball, *Nature Publishing Group*, Nov. 27, 2002, 4 pgs.

“Nanostructured Deposition of Nanoparticles from the Gas Phase”, by T.J. Krinke, *Part. Part. Syst. Charact.*, Aug. 2002, pp. 321-326.

News Report: “Nanoxerography Creating Nanoscale Photocopies”, Nov. 25, 2002, 1 page.

News Report: ECS-0229087 CAREER: Directed Assembly of Nanoparticles; A Tool to Enable the Fabrication of Nanoparticle Based Devices, Feb. 2, 2003; 1 page.

* cited by examiner

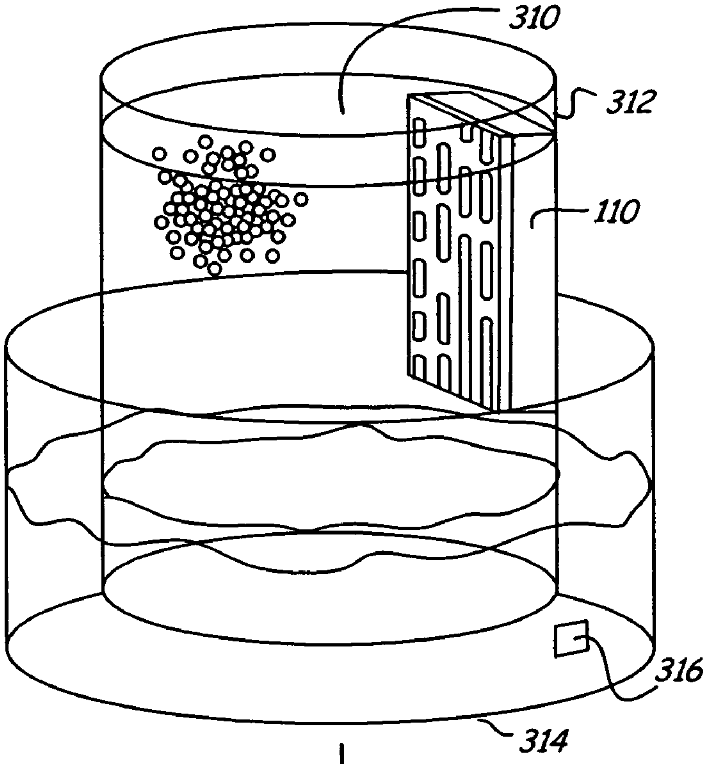
Fig. 3B1
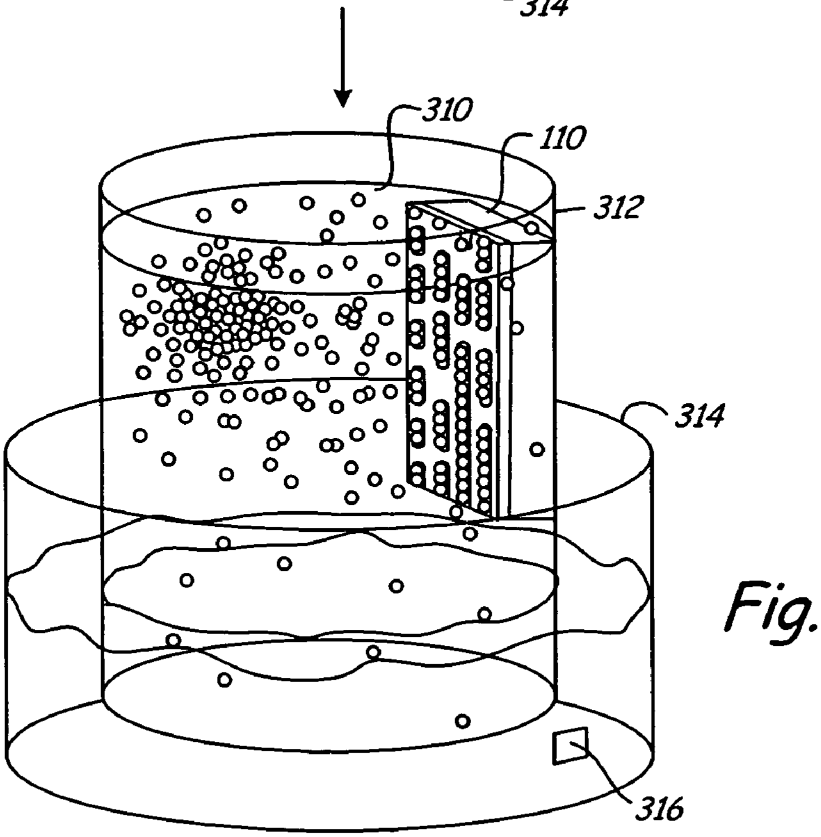
Fig. 3B2

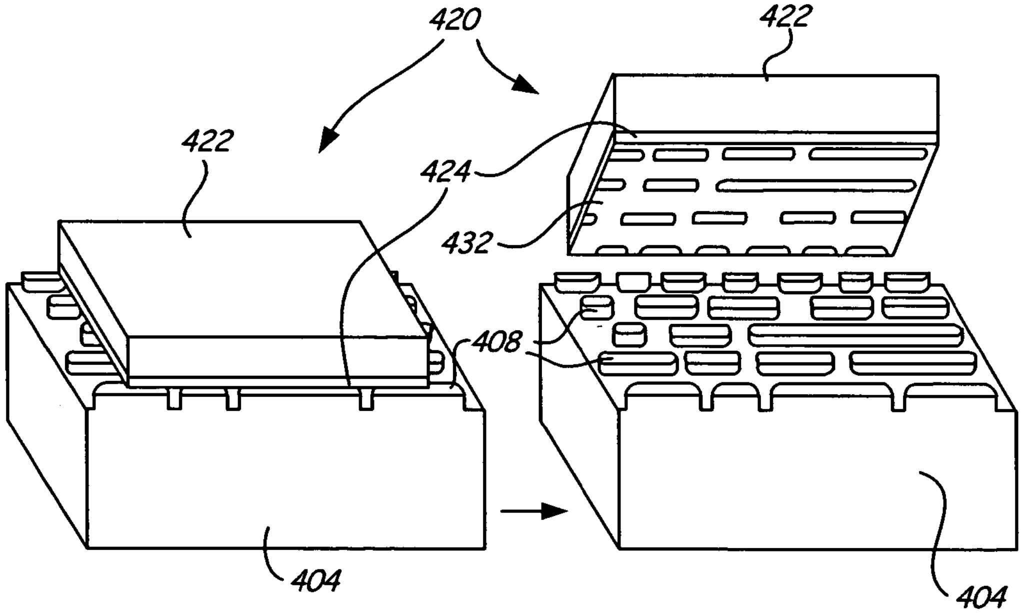
Fig. 4B1
Fig. 4B2

METHOD AND APPARATUS FOR DEPOSITING CHARGE AND/OR NANOPARTICLES

The present application is based on and claims the benefit of U.S. provisional patent application Ser. No. 60/517,327, filed Nov. 4, 2003, the content of which is hereby incorporated by reference in its entirety.

GOVERNMENT RIGHTS

The United States government has certain rights in this invention pursuant to Agency Grant No. DMI-0217538 awarded by DMII Grant NSF.

BACKGROUND OF THE INVENTION

The present invention relates to nanoparticles. More specifically, the present invention relates to the deposition of charge and/or nanoparticles.

There is an ongoing trend to miniaturize components and devices. Smaller components and devices allow more complex functions to be performed in a smaller volume and, in some configurations, can increase speed and reduce power consumption of a device. Small components have also found use in the biological and medical sciences. Today's forefront of miniaturization is generally referred to as "nanotechnology". One technique used in nanotechnology is based upon the use of organic and inorganic "nanoparticles".

Nanoparticles are considered the building blocks of many future nanotechnological devices. Nanoparticles are typically created in the gas or liquid phase. Most well known techniques include metal evaporation, laser ablation, solution vaporization, wire explosion, pyrolysis, colloidal and electrochemical synthesis, and generation from plasmas. Nanoparticles are of current interest for electronic and optoelectronic device applications, Silicon nanoparticles generated by silane pyrolysis or electrochemical reaction of hydrogen-fluoride with hydrogen-peroxide are used for non-volatile memories, lasers; and biological markers. Evaporated gold, indium, and ion sputtered aluminum nanoparticles are used for single electron transistors; and electron beam evaporated gold and silver particles are used for plasmonic waveguides. However, devices do not hold the only interest in nanoparticle generation. Nanoparticles also provide the foundation for the development of new materials and act as catalysts in nanowire synthesis.

The use of nanoparticles as building blocks, regardless of the application, requires new assembling strategies. Most actively studied approaches include: i) single particle manipulation, ii) random particle deposition, and iii) parallel particle assembly-based on self-assembly. Single particle manipulation and random particle deposition are useful to fabricate and explore new device architectures. However, inherent disadvantages such as the lag in yield and speed, will have to be overcome in the future to enable the manufacturing of nanotechnological devices. Fabrication strategies that rely on mechanisms of self-assembly can overcome these difficulties. Self-assembly techniques have begun to be used to assemble nanoparticles onto substrates. Current areas of investigation use geometrical templates, copolymer scaffolds, protein Recognition, DNA hybridization, hydrophobicity/hydrophilicity, magnetic interactions, and electrostatic interactions.

Stimulated by the success of atomic force based charge patterning, high resolution patterns have been used as templates for self assembly and as nucleation sites for molecules and small particles. Several serial charge-patterning processes have been explored to enable the positioning of nanoparticles. Scanning probe based techniques, for example, have been developed to pattern charge in silicon dioxide and Teflon like thin films. Serial techniques, however, remain slow—the fastest scanning probe-based system needs 1.5 days to pattern an area of 1 $cm^2$. This experimental bottleneck has led to the development of electric nanocontact printing to pattern charge in parallel. Electric nanocontact printing generates a charge pattern based on the same physical principles used in scanning probes but forms multiple electric contacts of different size and shape to transfer charge in a single step. With this method, patterning of charge with 100 nm scale resolution and transfer of 50 nm to 20 μm sized particles including iron oxide, graphite carbon, iron beads, and toner can be achieved. As a result several research groups have began investigating charge based printing. Krinke et al. assembled indium particles from the gas phase onto charged areas created by contact charging using a scanning stainless steel needle (T. J. Krinke et al., *Applied Physics Letters,* 2001, 78, 3708); Mesquida and Stemmer demonstrated the assembly of silica beads and gold colloids from the liquid phase onto charged areas created by contact charging using a scanning probe (P. Mesquida et al., *Microelectronic Engineering,* 2002, 61–62, 671; and P. Mesquida et al., *Surface and Interface Analysis,* 2002, 33, 159); and Fudouzi et al. demonstrated the assembly of $SiO_2$ and $TiO_2$ particles from both the liquid and gas phase onto charged areas created by focused ion and electron beams (H. Fudouzi et al., *Langmuir,* 2002, 18, 7648; and H. Fudouzi et al., *Materials Research Society Symposium Proceedings,* 2001, 636, D9.8/1).

However, there is an ongoing need for improved techniques and apparatus for the deposition and formation of nanoparticles and devices which use nanoparticles. One example technique is described in U.S. patent application Ser. No. 10/316,997, entitled ELECTRET MICROCONTACT PRINTING METHOD AND APPARATUS.

SUMMARY OF THE INVENTION

A method and apparatus for use in depositing electrical charge and/or nanoparticles is provided. In various aspects, the invention includes the use of a stamping process, including a stamp having a flexible layer such as a flexible semiconductor layer. Other aspects include lithographic patterning, deposition by ions or radiation, the use of differing work functions, the use of liquid phase materials, deposition monitoring techniques and apparatuses, the arrangement of an electric field and flow of nanoparticles across a substrate, and the use of electro-spraying techniques for polar solvents to print inorganic materials that are suspended in polar solvents.

BRIEF DESCRIPTION OF THE DRAWINGS

FIG. 1B is a perspective view showing the stamp of FIG. 1A applied to a substrate.

FIGS. 2B1–2B2 and 2C1–2C2 show alternative techniques for depositing a nanoparticle in accordance with the invention.

FIGS. 3A, 3B1, 3B2 and 3C are perspective views showing deposition of nanoparticles using an aerosol and a solvent, respectively.

FIGS. 4B1 and 4B2 are similar to FIG. 4A and show a configuration which does not use a separate voltage source.

DETAILED DESCRIPTION OF THE PREFERRED EMBODIMENTS

Non-Traditional Parallel Nanofabrication is a fast growing field that uses alternative methods to fabricate and pattern nanostructures at low cost. It is believed that these techniques will become an important part of future micro- and nanofabrication. Most of these techniques use a master to replicate nanostructures in parallel. Current research focuses on microcontact printing, molding, embossing, near-field photolithography topographically directed etching and topographically directed photolithography.

Figure 1A:
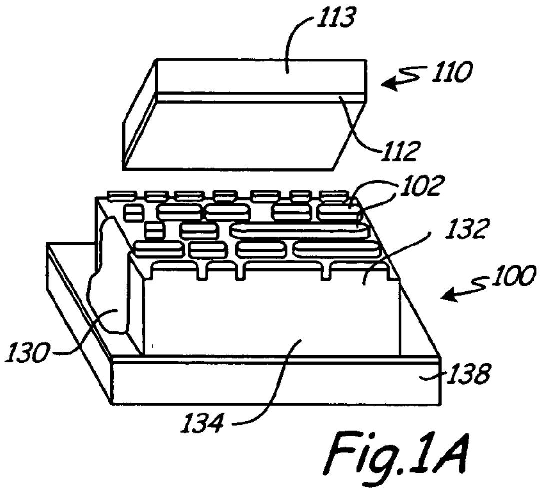
FIG. 1A is a perspective view of a stamp including a flexible substrate in accordance with the present invention.
Figure 1E:
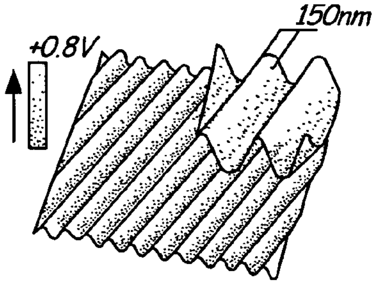
Figures 1, 1B:
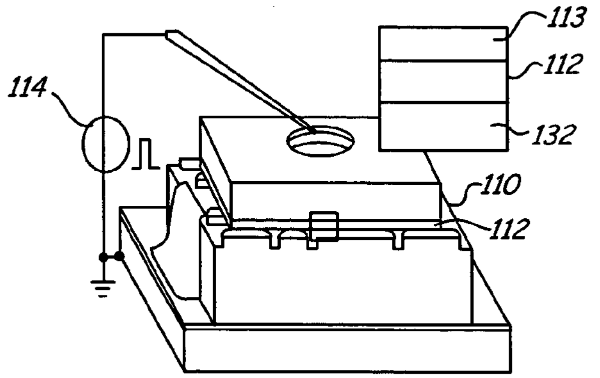
Figure 1F:
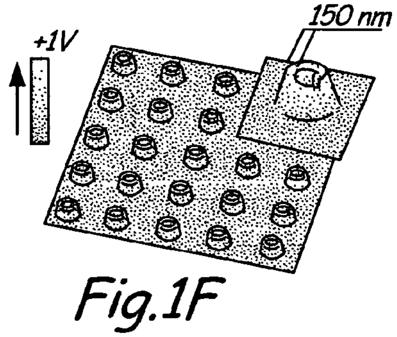
Figure 1C:
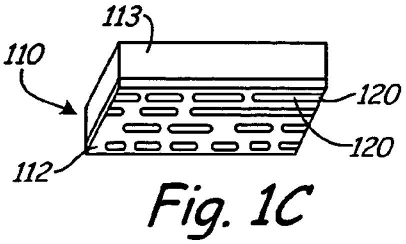
FIG. 1C is a perspective view of the substrate of FIG. 1B showing a resultant charge pattern deposited on the surface of the substrate.

FIGS. 1A, 1B and 1C illustrate steps of a stamping process in accordance with one aspect of the present invention. A flexible conducting stamp 100 is illustrated which includes surface features 102 formed thereon. FIG. 1B is a perspective view showing stamp 100 positioned in contact with a rigid support substrate 110. Rigid support substrate 110 is covered by a layer of photoresist, electret or other material 112 carried on conductive support 113 and a voltage pulse is applied between stamp 100 and rigid support 110 by voltage source 114. In the perspective view of FIG. 1C, the flexible stamp 100 has been removed and the pattern 120 has been transferred to the resist layer 112 carried on the rigid substrate 110.

In the configuration illustrated in FIGS. 1A–1D, an electrical contact 130 connects the copper plate to a coating of gold 132 which overlies the flexible electrode 134. The flexible electrode is carried on a copper plate 136. The interaction between the support 110 and the stamp 100 is better illustrated in the inset shown in FIG. 1B–1. This stamping process can be used in accordance with the techniques set forth herein.

Once the charge pattern 120 is formed on the substrate 110 as illustrated in FIG. 1C, nanoparticles can be deposited in accordance with any appropriate technique. For example, FIG. 1D is an example deposition process in which nanoparticles 130 are deposited and attracted to the charged region 120 on substrate 110.

Figure 1G:
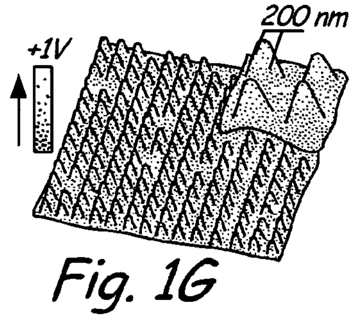
Figure 1D:
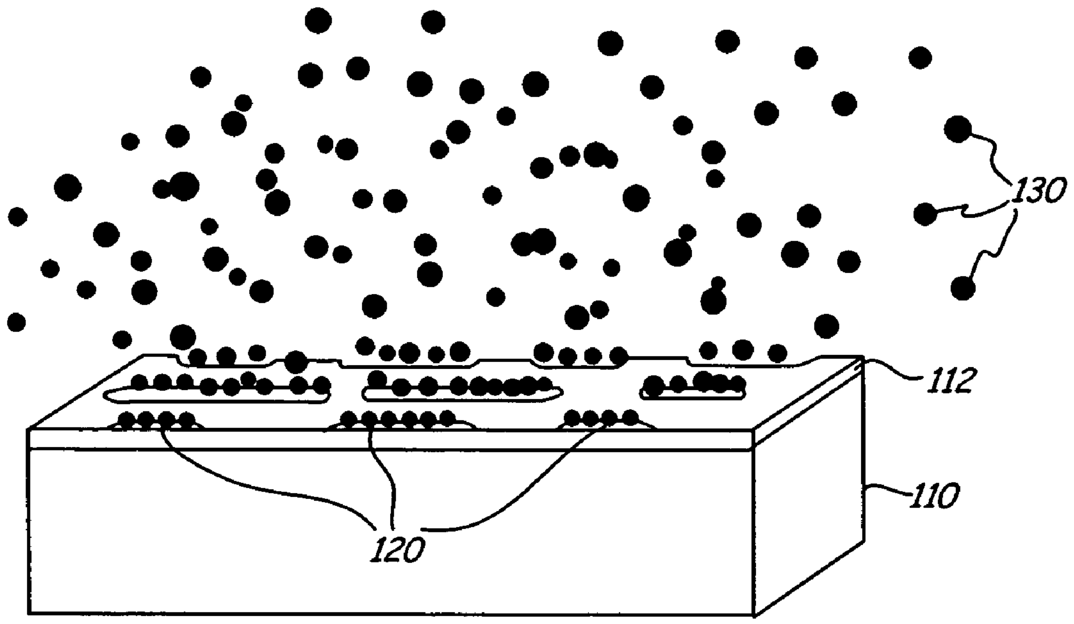
FIG. 1D is a perspective view of the substrate of FIG. 1C showing nanoparticles attracted to the charge pattern.

FIGS. 1E, 1F and 1G are views of various charge patterns 120 carried on substrate 110 along with dimensions.

In the configuration shown in FIG. 1A, the gold layer 132 has a thickness of 60 nm, the width of the stamp is 15 mm, the height of the flexible electrode is 5 mm and the thickness of the copper plate is 5 mm.

In this configuration, the stamp is used to expose a predefined area to electrons and electric fields. The stamp is placed onto the substrate surface and a voltage potential pulse is applied between the stamp and the substrate to expose the surface of the substrate material. Preferably, the stamp 100 is of a electrically conductive material and has sufficient flexibility to conform and contact a rigid surface 110. The stamp should support a pattern in bas relief with a minimal feature size of 100 nm or less. The electrical contact that is formed between the stamp and the substrate surface preferably provides uniform exposure across the surface. One example material is polydimethylsiloxane (PDMS). PDMS is a flexible polymer that can be cured by heating. A bas relief pattern can be formed using E-beamlithography and molding. A patterned surface of the PDMS stamp can be made electrically conductive by applying a conductive layer, for example by thermal evaporation of chromium (7 nm) as an adhesion promoter followed by an 80 nm layer of gold. The metal coated PDMS stamp can be used to apply a charge pattern on a thin electret film.

Once the charge pattern 120 is applied to the rigid substrate 110. The pattern 120 is used to attract nanoparticles generated using known techniques. The nanoparticles can be carried in a gas, fluid, or other medium and will adhere to the charged pattern 120. FIG. 1D is a perspective view of the substrate 110 showing nanoparticles 130 attracted to and adhering to charge pattern 120.

The process to pattern charge is illustrated in FIGS. 1A–1D. In one example, a silicon chip coated with a thin film electret was placed on top of a flexible conductive stamp. The stamp forms multiple electric contacts of different size and shape to the rigid surface and was used to electrically expose the selected surface areas. The stamp was poly(dimethylsiloxane) (PDMS), patterned in bas relief using procedures described before, it was –5 mm thick and supported on a copper plate. The patterned surface of the PDMS stamp was made electrically conducting by thermal evaporation of 80 nm of gold onto it. Thermal expansion of the PDMS stamps during the evaporation can cause the metal coating to buckle on cooling. To prevent buckling due to thermal expansion and contraction of the PDMS stamp, eight successive evaporation cycles each 1 min long were used, with 4 min waiting periods in between for cooling. The copper plates supporting the PDMS stamps were mounted 15 cm away from the metal source in our resistive thermal evaporator. (TSH 180H, Pfeiffer/Balzers, Germany). To electrically connect the stamp with the copper plate, InGa was applied onto the side walls of the stamp and at the interface between the stamp and the copper plate.

The charge storage medium was poly(methylmethacrylate) (PMMA, an 80 nm film, on a silicon wafer); PMMA is commercially available and is an electret with good charge storage capabilities. A 2% solution of 950 K PMMA in chlorobenzene (MicroChem Co.) and spin coating at 5000 rpm was used to form the film on the wafer. The wafers were <100> n-doped silicon with a resistivity of 3 Ωcm that were cleaned in 1% solution of hydrofluoric acid to remove the native oxide prior to spin coating. The spin-coated PMMA was baked at 90° C. for 1 h under vacuum. The wafer was cut into 1 $cm^2$ squares. To contact the chips electrically liquid InGa was spread onto the back side of the chip.

A metallic needle is attached to a micromanipulator to contact the liquid InGa on the backside of the chip. Upon contact the InGa wets the needle and forms a low resistance electrical contact. To generate a pattern of trapped charge, an external potential for (1–10 seconds) was applied between the needle and the copper plate. During the exposure the electric current that flowed through the junction was monitored and the voltage adjusted (10–30 V) to obtain −10 $mAcm^{-2}$ exposure current. To lift off the chip after exposure, the surface tension of the liquid InGa that forms a bond between the silicon and the metallic needle was used. This bond typically allows the chip to be lifted off by retracting the needle using the micromanipulator. In some cases, the use of tweezers is required. After lift off, the charge patterns can be characterized using Kelvin probe force microscopy (KFM). KFM uses the probe of an atomic force microscope (AFM) to detect electrostatic forces. A KFM procedure can be used to measure the charge and surface potential distribution with 100 nm scale resolution.

To assemble nanoparticles onto charged areas, three different procedures were investigated. In the first procedure, PMMA-coated chips carrying a charged pattern were dipped into dry powders of nanoparticles and the pattern developed by blowing away the loosely held material in a stream of dry nitrogen. In the second procedure, chips carrying a charge pattern were exposed to a cloud of nanoparticles. The particle cloud was formed inside a cylindrical glass chamber (10 cm in diameter and 5 cm high) using a fan to mix the nanoparticles with the surrounding gas (air or nitrogen). A laser pointed was used to visualize (due to scattering of light) the suspended nanoparticles in the chamber. This particular configuration can be used to test whether nanoparticles can be assembled onto charged areas directly from the gas phase. In the third procedure, a liquid suspension of nanoparticles was used. As a solvents, perfluorodecalin (#601, Sigma-Aldrich, USA) and Fluorinert FC-77 were used, which are non-polar solvents with relative dielectric constants of 1.8. To agitate the nanoparticles, an ultrasonic bath (Branson 3510, DanBury, Conn.) was used. Commercially available carbon toner, red iron oxide particles, and graphitized carbon particles were used.

The nanoparticles 130 can be deposited in accordance with any appropriate technique. In accordance with various examples of the present invention, a PMMA substrate having a charge pattern can be dipped into dry powders, liquids, or placed in a flow, such as a liquid or air flow, of nanoparticles to thereby deposit the nanoparticles on the charge pattern. One advantage of using an aerosol over a liquid suspension for carrying the nanoparticles is that in the aerosol it is possible to control the charge the particle. Particles in an aerosol can be charged to an upper limit, which depends upon the particle diameter. For a 100 nm sized particle, a typical number for most materials is between 50 and 200 elementary charges. To trap a single 100 nm size particle at a charged surface site, it is necessary to have about the same amount of charge on both the particle and the charged surface. Using the techniques of the present invention, a charged density of 100 elementary charges per surface area of 100 nm by 100 nm can be achieved.

Figure 2A:
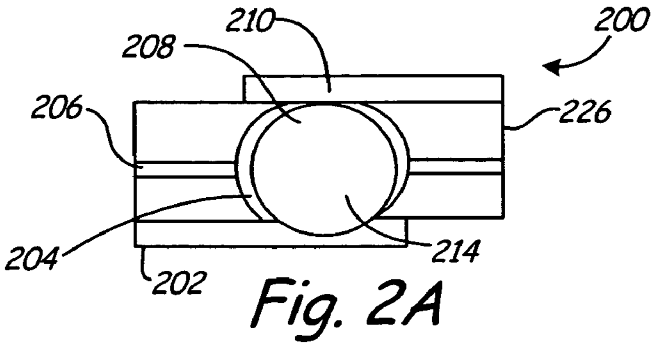
FIG. 2A is a side cross-sectional view of a vertical flow field effect transistor made in accordance with the invention.
Figure 2D:
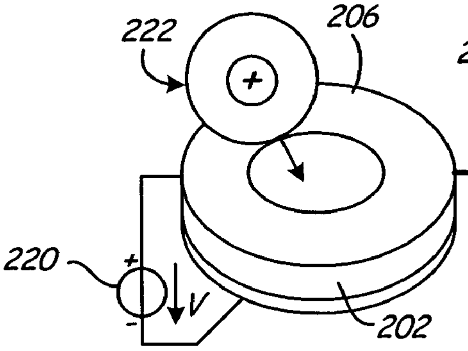
FIG. 2D is a perspective view showing the field effect transistor showing deposition of a subsequent layer.
Figure 2D:
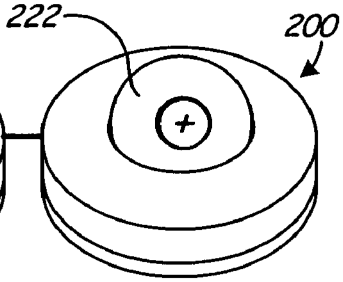
Figure 2D:
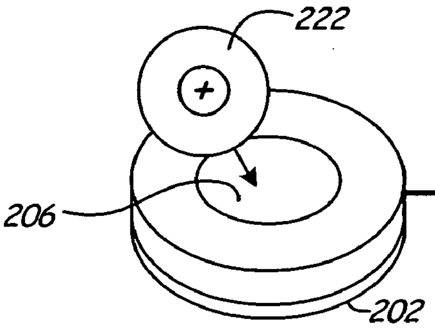
Figure 2D:
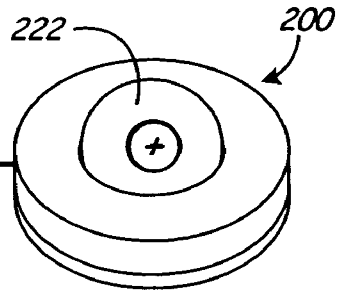
Figure 2D:
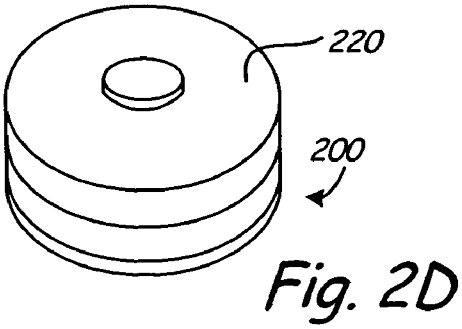
Figure 2E:
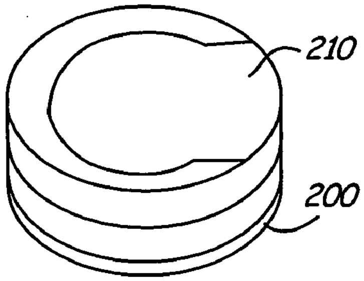
FIG. 2E is a perspective view of the field effect transistor showing deposition of a contact.

One aspect of the present invention includes fabrication of devices using the techniques set forth herein, along with devices fabricated with such techniques. For example, FIG. 2A is a side cross-sectional view of a vertical flow field effect transistor 200. Transistor 200 includes a source metal 202, a gate oxide 204 such as $SiO_2$, a gate metal 206, a drain alloy (ohmic) 208 and a drain metal 210. The vertical flow field effect transistor consists of an oxide silicon nanoparticle of less than 100 nm that is embedded between three electrodes. The source 214 is of a silicide. As illustrated in FIG. 2B1, in one configuration, a voltage source 220 is applied between the source metal 202 and the gate metal 206. In the illustrated configuration, a negative charge is formed which attracts the charged nanoparticle 22. The charged nanoparticle is seated in the opening as illustrated in FIG. 2B2. In an alternative configuration, different patterns of surface charge are exploited to fabricate the transistor. In this configuration, a charge is patterned onto the gate dielectric to generate a stray field. This charge pattern can be formed using the techniques described above. As illustrated in FIG. 2C1, the charge pattern attracts the nanoparticle 222 to the location illustrated in FIG. 2C2. In FIG. 2D, the transistor structure is shown after depositing and polishing an upper insulating layer 226. The top electrode 210 is illustrated in FIG. 2E deposited on the top surface of transistor 200.

Figure 3A:
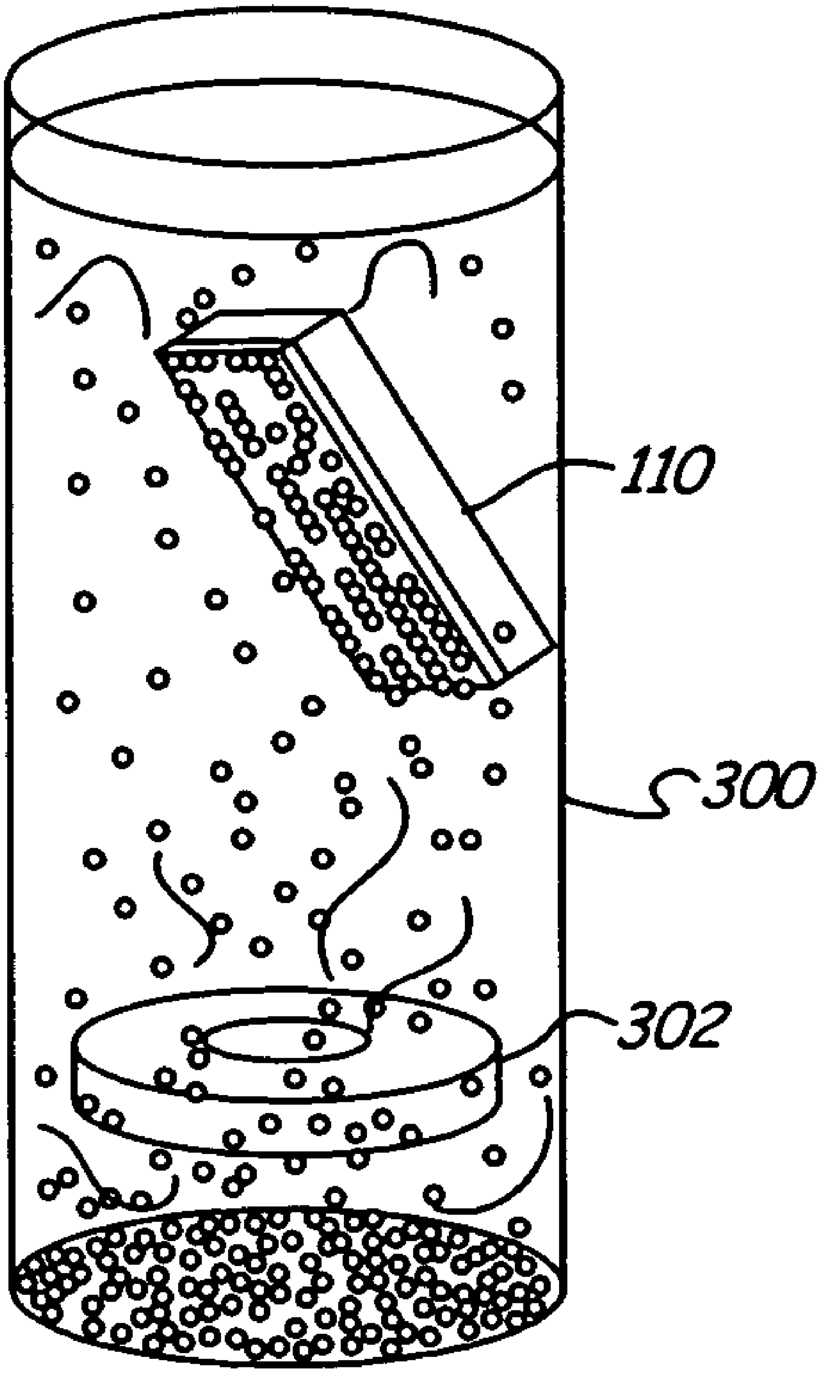

Various different techniques can be used to deposit the nanoparticles upon the substrate 110. FIG. 3A is a perspective view showing one example embodiment in which nanoparticles are carried in a gas phase. For example, 100 nm sized nanoparticles can be contained in a container 300. A fan 302 is configured to blow the nanoparticles within the container 300. The nanoparticles can be visualized, for example, using a laser which is scattered by the particles. FIGS. 3B1 and 3B2 show another example embodiment in which the nanoparticles are carried in a solution 310 contained in a vessel 312. The nanoparticles can be suspended in a desired solvent with different polarities and dielectric constants. For example, in one specific experiment, graphitized carbon particles having a mean diameter of 30 nm were suspended in an non-polar solvent (perfluorodecalin). In order to prevent coagulation of the carbon particles, the container 310 can be placed in a ultrasonic bath 314 in which a sonicater 316 agitates the solution 310.

Figure 3C:
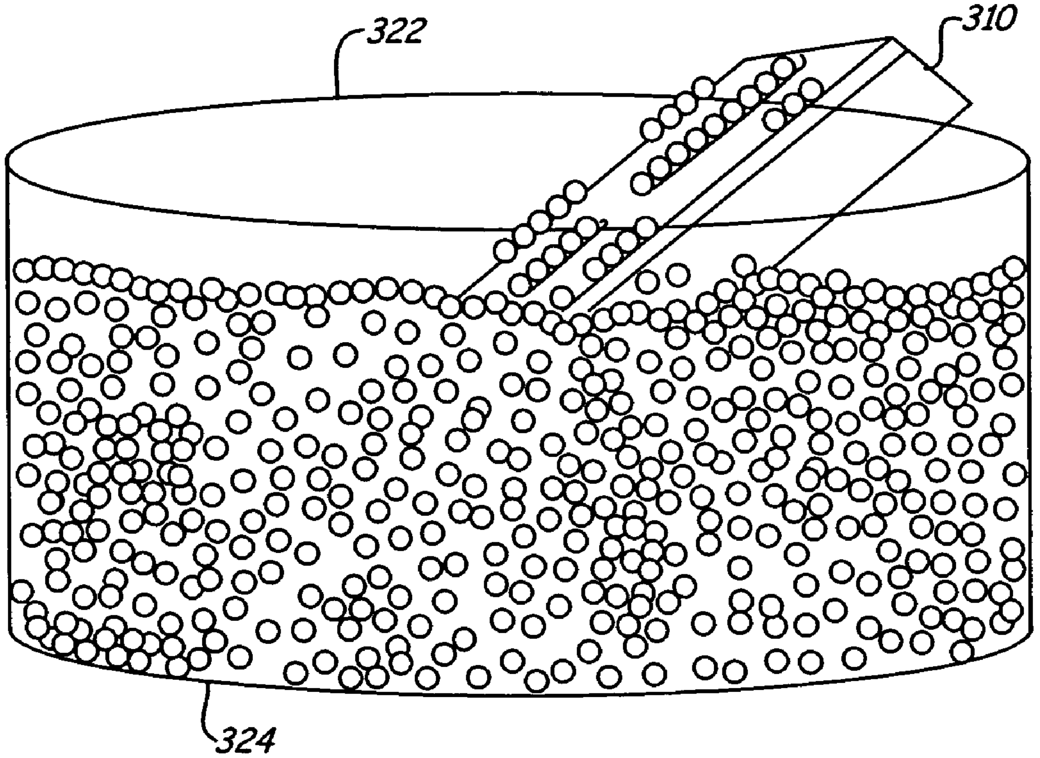

FIG. 3C is a view of another example embodiment in which the substrate 310 is placed into a container 322 containing nanoparticles 324 in a powdered form. Following dipping the substrate 310 into the powder, the substrate 310 can be removed and placed in, for example, a stream of dry nitrogen to remove any excess particles that did not assemble onto the surface of the substrate.

In another example embodiment, two different flexible electrodes were used to accomplish charge transfer. The first electrode prototype was made out of a 5 mm thick poly-(dimethylsiloxane)(PDMS) stamp, patterned in bas relief using procedures described before. To make the stamp electrically conducting, it was supported on a copper plate and a 60 nm thick gold film was thermally evaporated onto it. InGa (a liquid metal alloy, Aldrich) was applied to the sidewalls of the stamp to provide a good contact to the copper plate. The second electrode prototype was made from a 3 inch in diameter, 10 μm thick, n-doped silicon wafer (Virginia Semiconductors). Patterns in bas-relief, consisting of features as small as 50 nm were transferred into the silicon by photolithography and etching in a 98% $CF_6$, 2% $O_2$ plasma. The n-doped silicon is sufficiently conductive and does not require a metal coating. To provide an equal pressure distribution and uniform electric contact, the non-patterned side of the thin silicon electrode was placed on a gold-coated flat piece of PDMS on a copper plate.

As the electret, two different dielectric materials, poly-(methylmethacrylate)(PMMA), a commercially available electret with good charge storage capabilities, and $SiO_2$ were used. For the PMMA electret, a 2% solution of 950 K PMMA in chlorobenzene (MicroChem Co.) was used and spin coating at 5000 rpm to form a thin film on a silicon wafer. The wafer was cleaned in a 1% solution of Hydrofluoric acid to remove the native oxide prior to spin coating. The spin-coated wafer was bake in an over at 90° C. for 1 hour. For the $SiO_2$ electret, a 50 nm thick wet oxide was thermally grown in an oxygen furnace at 1100° C. for 30 minutes. Both electrets were formed on <100> n-doped silicon wafers with a resistivity of 3 ohm cm that were cut into 0.5–1 $cm^2$ sized chips after processing. To form an electrical connection liquid InGa was spread on the backside of these chips. The chips were placed on the flexible electrode by hand and contacted with a metallic needle attached to a micromanipulator.

To generate a pattern of trapped charge, an external potential was applied for 1–10 seconds. During the exposure current of 0.1–1 mA. After exposure, the charge patterns were characterized using Kelvin Probe Force Microscopy (KFM). KFM involves the use of an Atomic Force Microscope (AFM) probe to detect electrostatic forces. A KFM procedure was used that enables measuring the charge and surface potential distribution with 100 nm scale resolution.

Figure 4A:
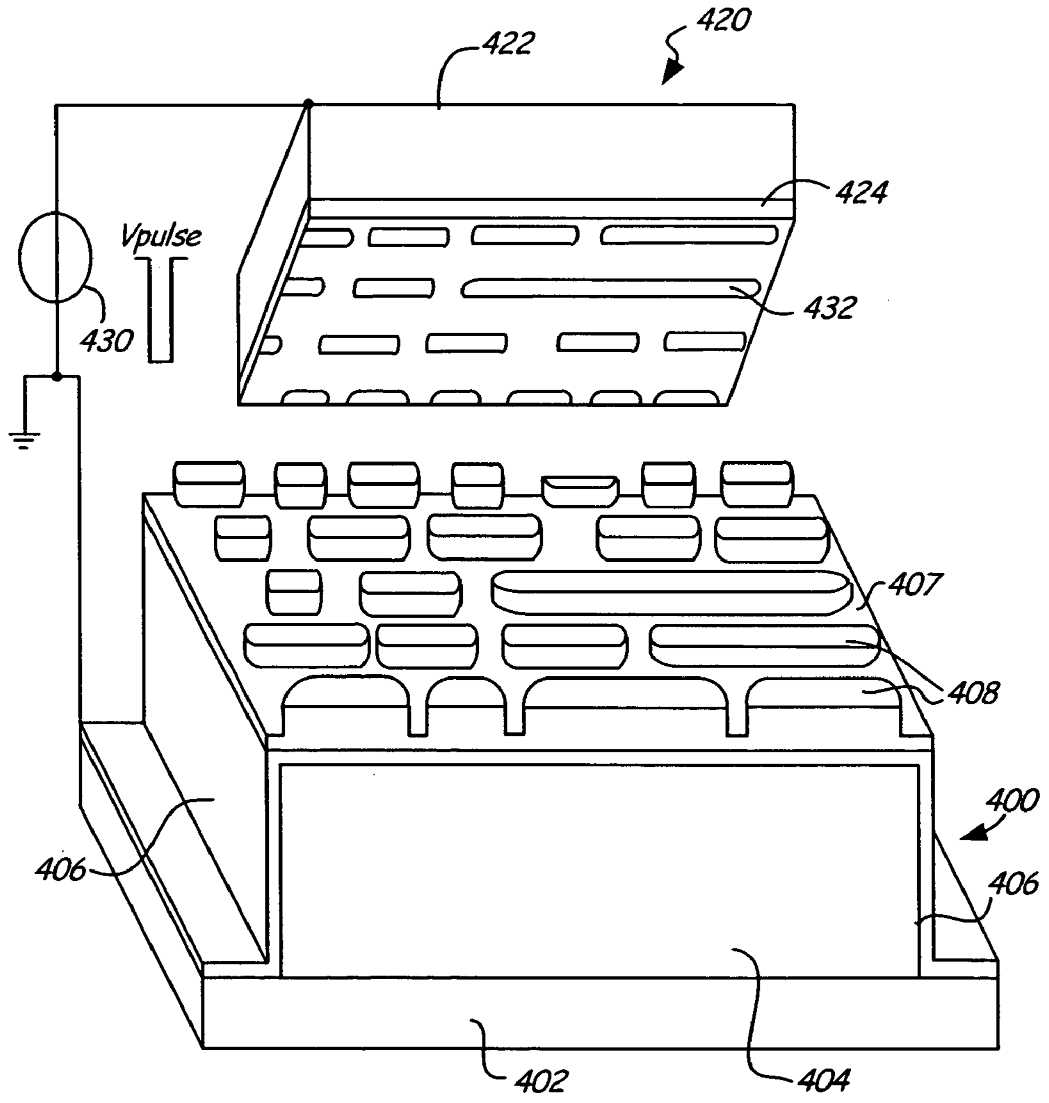
FIG. 4A shows a more detailed view of the charge patterning process of the invention using a thin silicon electrode.

FIG. 4A provides a perspective view of the stamping process discussed above in which a thin silicon electrode is used in place of a PDMS electrode. In this configuration, the stamp 400 includes a copper or otherwise conductive plate 402 having a thickness of 10 mm which carries a support layer of PDMS 404. The support layer 404 has a thickness of about 5 mm. A conductive contact coating 406, for example of gold, is provided. Coating 406 is covered with a flexible layer 407 of silicon. The substrate 420 is formed of silicon, which provides a conductive support 422. The support 422 is covered with an electret layer 424. The pattern 408 contacts the electret 424. A voltage is applied using voltage source 430. When the stamp 400 is removed, a charge pattern 432 is left on the electret layer 424. FIGS. 4B1 and FIG. 4B2 are similar to FIG. 4A and show a configuration in which a voltage source 430 and the resulting voltage pulse are not used to transfer charge. Instead, charge is transferred purely through contact between the stamp and the substrate.

Figure 5A:
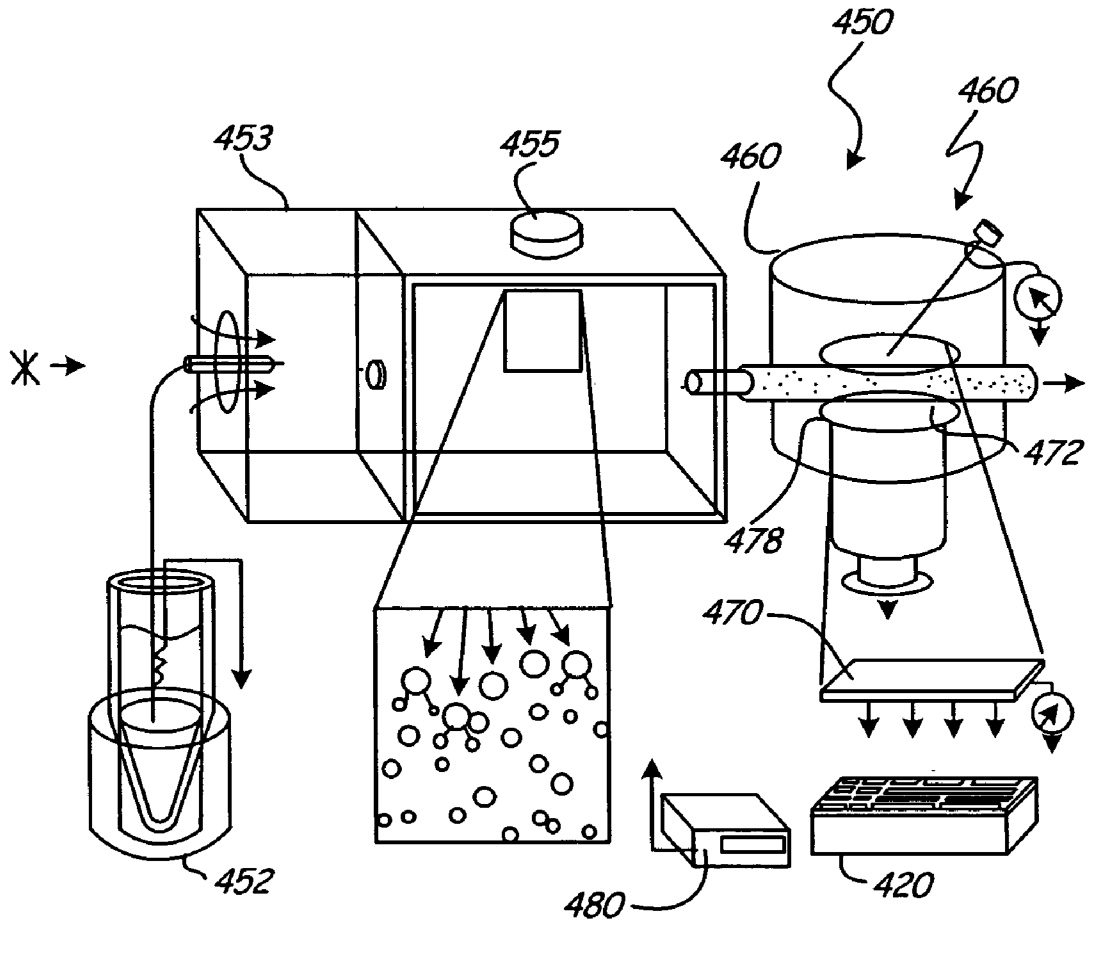
FIG. 5A is a simplified diagram showing an apparatus for use in depositing nanoparticles onto a substrate in accordance with the invention.
Figure 5B:
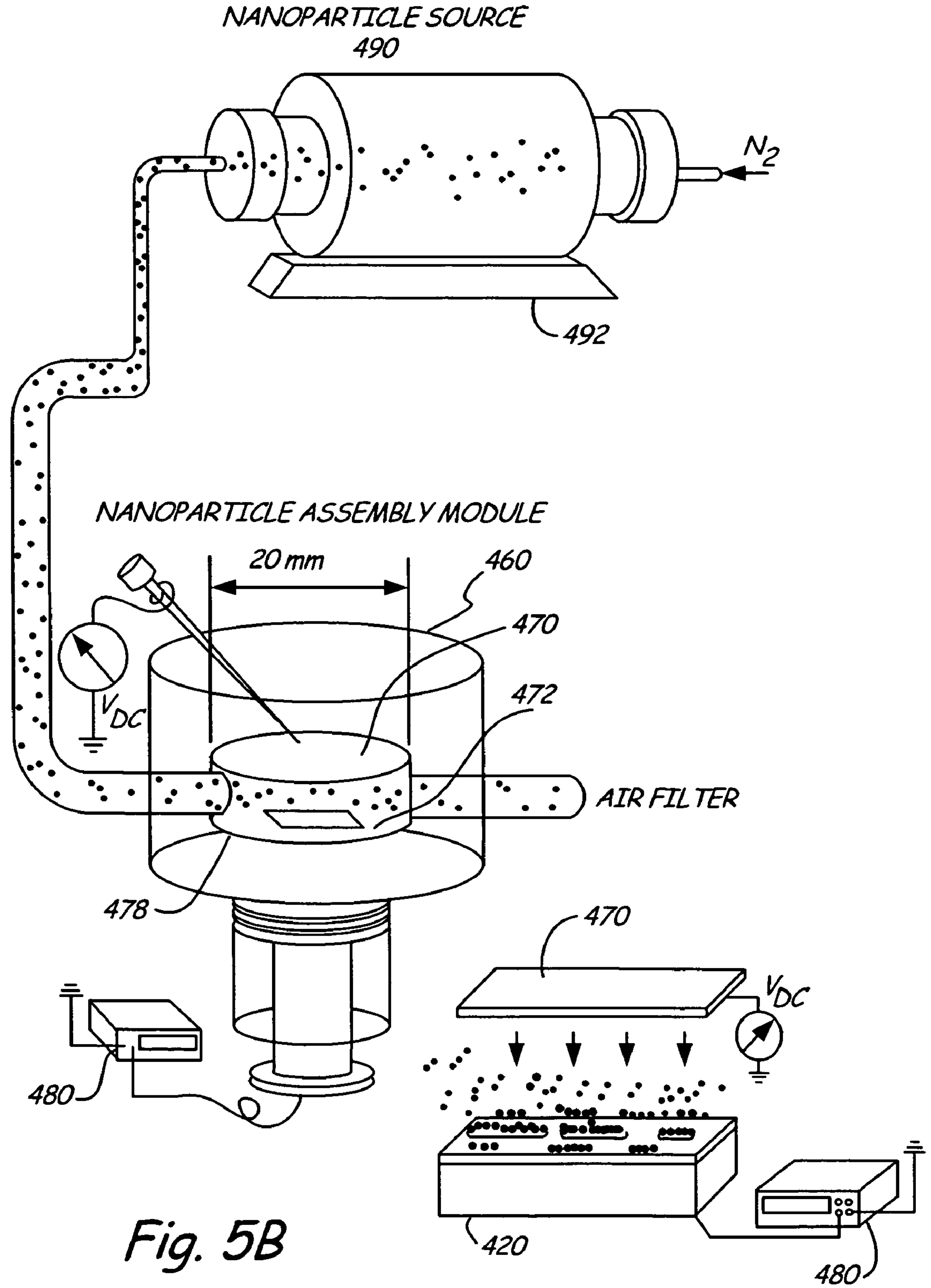
FIG. 5B is a diagram similar to FIG. 5A in which nanoparticles are carried in a gas which is blown across the surface of a pattern substrate.

Following the application of the charge pattern 432 onto the surface of the electret 424, the support structure 420 is placed into a nanoparticle deposition apparatus in accordance with any of the techniques discussed herein, for example, the apparatus 450 illustrated in FIGS. 5A and 5B. The deposition apparatus 450 includes a nanoparticle source 452, in which the material to be assembled is suspended in a solution. A platinum electrode wire, intertwined with a silica capillary, is inserted into the solution vial 452 after being placed in a sealed chamber of the apparatus. The chamber pressure is increased and a potential of 0–5 kV is applied to the platinum electrode. The pressure difference forces the solution up through the capillary and out to the tip. The applied potential is adjusted until a cone jet mode is achieved that releases a stream of droplets. A sheath gas mixture of compressed air and $CO_2$ carry the electrosprayed material from the capillary tip through chamber 453 to the deposition chamber 460. Chamber 453 includes a charge neutralizer 455 which reduces the charge on the droplets as they evaporate. An aerosol of nanoparticles, containing only a few charges per particle, forms and enters the deposition chamber 460. In this configuration, a top electrode 470 and a bottom electrode 472 within the deposition chamber 460 provide an electric field which is perpendicular to the direction of flow of the nanoparticles across the surface of the support 420. In one configuration, an optional window 476 is provided into the chamber 460 for use in monitoring the deposition process. For example, a laser can be directed into the chamber and the scattering due to nanoparticles monitored. Further, the deposition of nanoparticles can be directly observed through the window. Another monitoring technique is the use of the support 420 as a faraday cup 478 during the deposition process. This faraday cup 478 can be used to monitor the amount of nanoparticles which have been deposited. An electrometer 480 is illustrated for use in measuring the amount of assembled, charged particles during the assembly process. FIG. 5B is another example embodiment in which the nanoparticles are introduced in a gaseous form generated by nanoparticle source 490 in which a gas such as $N_2$ is introduced through a tube furnace 492 which is used to generate nanoparticles. The nanoparticles, carried in the $N_2$, are blown across the surface of the substrate 420 in the nanoparticle assembly module 460. During operation, a constant flow of nanoparticles is generated by evaporation of matter in the tube furnace, transport of the atoms to the outlet by an inert gas (such as nitrogen or argon), and condensation. The directed assembly of the nanoparticles occurs in the particle assembly module. An external potential, $V_{DC}$, is applied to the top electrode and directs incoming nanoparticles to the charged sample surface. The electrometer measures the amount of assembled charged particles during the assembly process.

Figure 6:
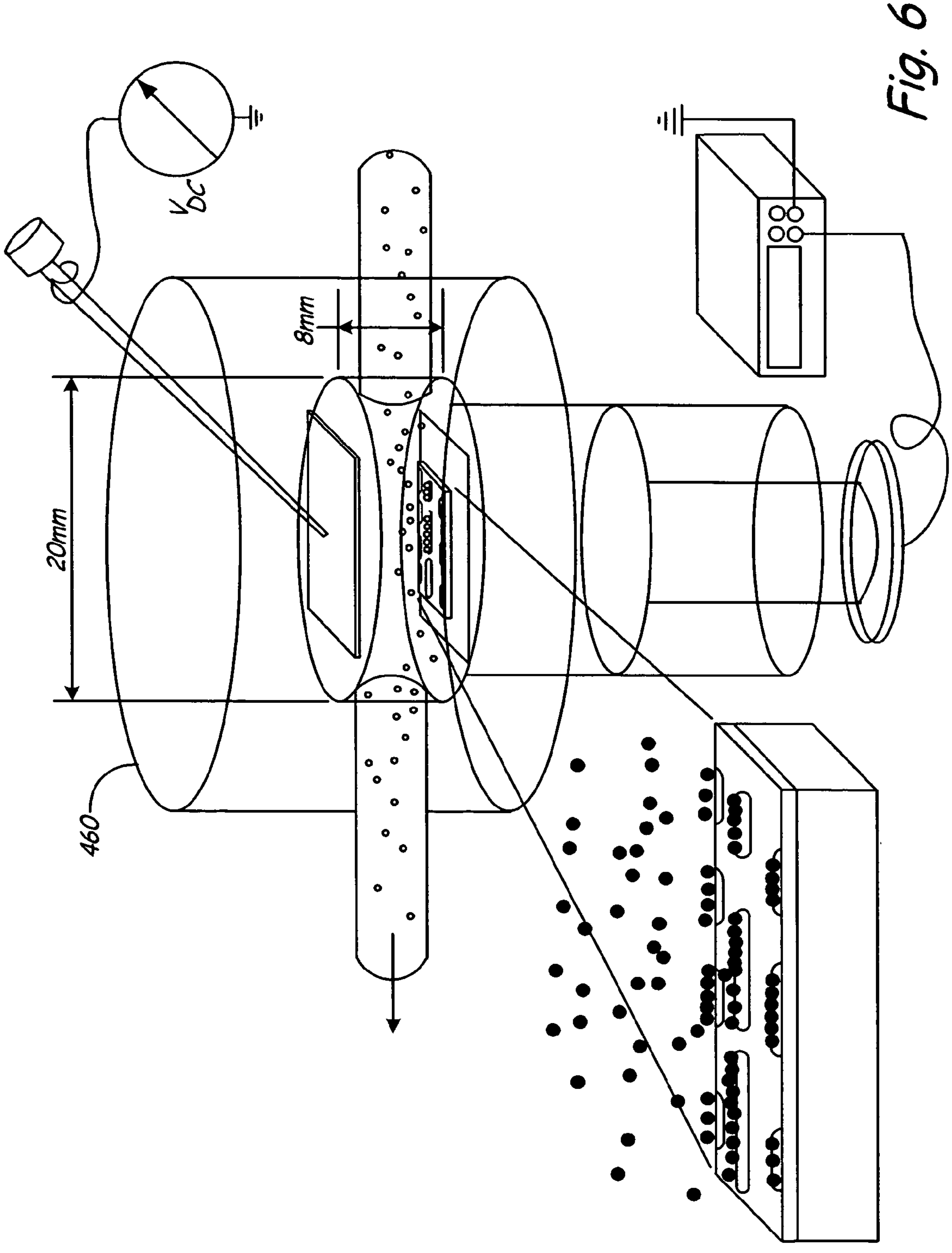
FIG. 6 is a more detailed view of the generic nanoparticle printer assembly module of the present invention that is adaptable to any particle source.

FIG. 6 is a simplified diagram showing the adaptable generic nanoparticle printer assembly module 460 in greater detail.

Assembly of nanoparticles from the gas phase can be used. A particle assembly module was used which consists of a cavity that holds the sample, two electrodes to generate a global electric field that directs incoming charged particles towards the sample surface, and an electrometer to count the charge of the assembled particles. This module is attached to a tube furnace that generates the nanoparticles by evaporation and condensation.

The particle assembly module can be constructed mainly out of PDMS. PDMS is transparent and can be molded around readily available objects in successive steps to form 3-dimensional structures. In the first step, the cavity is formed by molding PDMS around a 20 nm in diameter and 8 mm tall disk that was removed after curing the PDMS at 60° C. In the second step, a sample exchange unit is formed by attaching a rigid polyethylene tube to the cavity using PDMS. The tube holds the retractable cylinder that carries the sample. To form a particle inlet and outlet a stainless steel tube 5 mm in diameter was inserted into each side of the PDMS shell.

To direct the assembly of incoming charged particles two electrodes are integrated in the transparent assembly module. A 2 cm long and 1 cm wide electrode located at the top of the cavity and a 1.5 cm by 1 cm wide electrode underneath the sample. During operation, the electrodes are spaced by approximately 7 mm and an external voltage is applied of up to ±1000V to bring charged particles of one polarity into the proximity of the charged sample surface.

To monitor the amount of particles that assembled onto the sample under different assembly conditions a faraday cup in the assembly module can be used. In a faraday cup arrangement, the sample forms the cup electrode and is connected to ground with the electrometer (Keithley 6517A) in between. During assembly, image charges flow from the ground through the electrometer into the sample to the location of assembled, charged particles. As a result, the electrometer measures the charge of the assembled particles.

The particles were generated in a tube furnace. The material to be evaporated was placed inside the quartz tube at the center of the furnace. Pure nitrogen was the carrier gas that flowed through the system during operation. The evaporation was carried out at 1100° C. for gold and silver, and 850° C. for NaCl, KCL, and MgCl. A vapor containing atoms of the evaporated material forms within the furnace. The nitrogen carrier gas transports the atoms out of the furnace where they nucleate and condense into particles due to the change in temperature. The gas flow carries the nanoparticles into the particle assembly module through a 1-meter long Tygon tube.

A first order estimate of the trapped charge density can be calculated from the recorded surface potential distribution. Trapped charge inside or on the surface of the PMMA film will attract mobile charge carriers inside the silicon substrate, resulting in the formation of a double layer. For a double layer separated by a distinct distance d, the charge density $\sigma$ can be calculated with $\sigma=\epsilon\Delta V/d$, where $\epsilon$ is the permittivity, and $\Delta V$ is the voltage drop across the layer. For $\epsilon=8*10^{-12}$ C/(Vm) (permittivity of PMMA), $\Delta V=1V$ (measured potential change), and d=50 nm (assumed intermediate distance between the counter charges), a first-order estimate of the effective charge density of $\sigma_{eff}=100$ elementary charges per surface area of 100 nm by 100 nm is obtained. Based on these assumptions a fully charged 0.5 $cm^2$-sized chip will contain 40 nC. The exact number of this upper limit depends on the actual distribution of the charges inside the PMMA film and the silicon substrate, and on the portion of the chip surface that is patterned.

These charge patterns attract nanoparticles. The resolution achieved over large areas is 190 nm. The highest resolution achieved is 60 nm. Along with silver, ordering of gold, indium, gallium, magnesium, iron oxide, graphitized carbon, sodium chloride, potassium chloride, magnesium chloride, silica beads, polystyrene beads, colloidal particles, silicon particles, and proteins was observed.

The global electric field and the electrometer reading are two important parameters to control the assembly process, the particle polarity that assembles on the surface, the speed of the assembly, and the coverage. Nanoparticles assembled well on positively charged areas by applying a negative potential to the top electrode, whereas for negatively charged areas, a positive potential was required. The polarity of the external potential also defined which majority, positively or negatively charged particles, assembled onto the sample. At a positive potential of 1 kV and a flow rate of 1 ccm/s the charge on the sample, recorded by the electrometer, increased by +4 nC in one minute, whereas at a negative bias of −1 kV the charge increased by −4 nC. No increase in charge was observed without flow. This result can be explained by the coexistence of positively and negatively charged particles that are transported through the system. This result is interesting because it is not obvious how the particles become charged in the evaporative system. One possible explanation is that the nanoparticles as well as the carrier gas are charged by thermal ionization and natural radiation ionization. Both mechanisms are known in aerosol systems. The global electric field also effected how fast the assembly took place. At 1 kV the assembly time to get good coverage was 1 minute whereas at 100V it took 10 minutes to obtain the same coverage. A clear proportionality between the electrometer reading and the coverage was also observed. Excellent coverage and high selectivity were obtained when 4 nC of charged particles accumulated on the sample, whereas at 10 nC the sample would be fully coated.

These nanoprinting techniques depend on a high resolution charge patterning technique. To enable such nanoprinting, a parallel charge patterning strategy that extends previous serial techniques for patterning charge into a parallel method and provides a parallel method for patterning charge in electrets. The charge patterning is based on a flexible electrode structure that forms multiple electric contacts of different size and shape to an electret surface. The resolution is currently limited by the smallest possible feature size that can be fabricated on the electrode structure. For the PDMS based electrode structure, this limit is approximately 100 nm. Smaller features tend to collapse. Higher resolution may be accomplished with the thin silicon based electrode prototype. Silicon is capable of supporting 10 nm sized features. Changing the exposure time and current has little effect on the amount of charge transferred. In several experiments, the surface potential remained the same whether the sample was exposed to a current of 100 μA for 2 seconds or to a current of 10 mA for 30 seconds. This result suggests that the maximum charge level might be achieved with even smaller exposure times and currents.

With the present invention, nanoprinting 10–200 nm sized nanoparticles can be achieved from the gas phase. The resolution is typically between 100–200 nm, which is 500–1000 times the resolution of traditional xerographic printers, but sub-100 nm resolution has been accomplished. A particle assembly module that selects and directs charged particles towards the sample surface is used. This assembly module could be attached to other gas phase particle systems. The module allows the study of particle assembly as a function of the global external field and flow rate. The ability of monitoring how many charged particles have assembled on the chip surface during the experiment has been very useful in optimizing this procedure. The assembly process probably depends on the actual charge on the particle, the electric polarizability of the particle, the thermal energy of the particle, the electric field strength at the substrate surface, the Van de Waals interaction between the particles and substrate surface, the surrounding medium, and the pressure.

Figure 7:
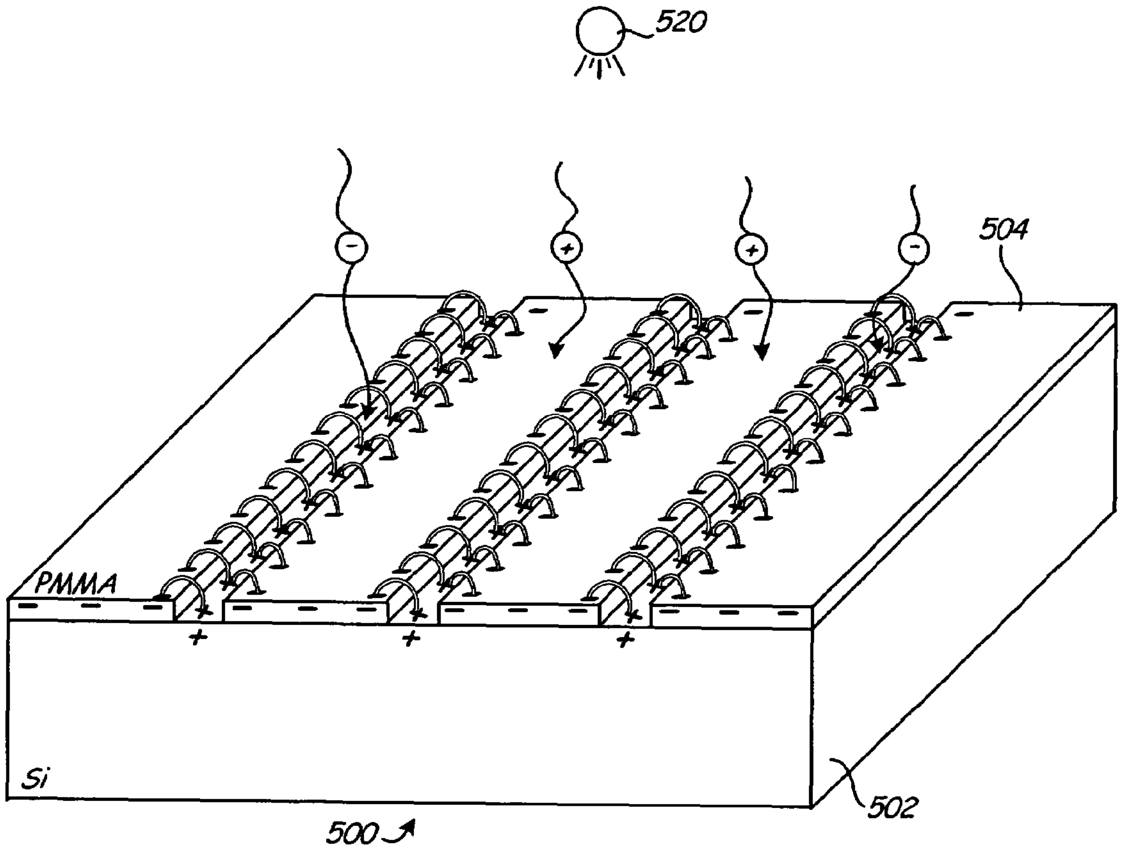
FIG. 7 is a perspective view of a pre-patterned substrate as another embodiment of a stamp or as its own mechanism in accordance with the present invention in which dissimilar materials are used to form a charge pattern.

Returning to the description of FIG. 1, various other techniques for charging the flexible substrate are provided in accordance with the present invention. In another example technique, stamp 100 is formed of two different materials, one insulating and one conducting. Such a configuration is illustrated in FIG. 7 in which a stamp 500 is formed of a silicon substrate 502 and a patterned layer 504. In the illustrated embodiment, the patterned layer 504 comprises PMMA. FIG. 7 also illustrates a positive charge carried on substrate 502 and a corresponding negative charge carried on the patterned layer 504. The materials are charged by irradiating them with electrons, ions, X-rays, ultraviolet light, or from some other source. Such a source is illustrated at 520. Prior to irradiation, the conducting and non-conducting materials are patterned using, for example, lithography. The charging from the irradiation will reflect the pattern formed in the material. For example, non-conducting materials which are patterned on a conducting support will become highly charged by direct irradiation with ions or electrons. In another example, the pattern in the stamp is formed using pattern materials having differing electrical properties and differing work functions. The patterned material exposes a charge pattern to compensate for the work function differences between the materials. This charge pattern creates a fringing electrostatic field. In another example, an electrostatic force due to a high resolution externally biased electrode and electrode arrays can be used. The patterning can be formed by either raised areas or by recessed areas.

Although the present invention has been described with reference to preferred embodiments, workers skilled in the art will recognize that changes may be made in form and detail without departing from the spirit and scope of the invention. Although a silicon overlayer is shown, any appropriate overlayer can be used in accordance with the present invention. In one embodiment, the overlayer comprises a semiconductor. With a silicon overlayer, features as small as 10 nm can be etched into the overlayer for use in the stamping process. Thinness of the overlayer allows the overlayer to flex and thereby provide improved stamping properties. Other semiconductor materials include GaN GaaS or Germanium. In one embodiment, the thin Si layer is a wafer having a thickness of 10 micrometers. Other thicknesses can be used. The Si layer can also be grown on the surface of the stamp.

What is claimed is:

1. A method of depositing nanoparticles on a substrate, comprising:
- obtaining a flexible stamp having a pattern formed thereon, the flexible stamp including a flexible overlayer of semiconductor material forming the pattern;
- applying the flexible stamp to the substrate to form a charge pattern on the substrate; and
- depositing nanoparticles on the charged pattern on the substrate.

2. The method of claim 1 wherein the semiconductor material comprises silicon.

3. The method of claim 1 wherein the flexible overlayer of semiconductor material has a thickness of 10 micrometers.

4. The method of claim 1 including forming the pattern on the stamp using a lithographic process.

5. The method of claim 1 including applying a voltage pulse between the stamp and the substrate while the stamp is in contact with the substrate.

6. The method of claim 1 including a using a lithographic pattern on the stamp to form a charge pattern.

7. The method of claims 1 wherein depositing nanoparticles includes placing the substrate in a liquid.

8. The method of claim 7 wherein the liquid includes nanoparticles carried in a suspension.

9. The method of claim 8 including moving the liquid to distribute the nanoparticles.

10. The method of claim 9 wherein moving includes applying a sonicator.

11. The method of claim 1 wherein depositing nanoparticles comprises electrospraying.

12. The method of claim 11 wherein the electrospraying uses a solution comprising nanoparticles suspended. in a polar solvent.

13. A method of depositing nanoparticles on a substrate, comprising:
- covering a stamp substrate with a layer of material that is different from the stamp substrate;
- constructing a pattern in the top layer;
- applying the stamp substrate to the substrate to form a charge pattern on the substrate;
- depositing nanoparticles on the charge pattern on the substrate; and
- wherein depositing nanoparticles includes placing the substrate in a deposition chamber.

14. The method of claims 1 or 13 wherein the charge pattern is formed through contact charging.

15. The method of claims 1 or 13 including using ions to form the charge pattern.

16. The method of claims 1 or 13 including using x-rays to form the charge pattern.

17. The method of claims 1 or 13 including ultraviolet light to form the charge pattern.

18. The method of claims 1 or 13 including using differing work functions to form the charge pattern.

19. The method of claims 1 wherein depositing nanoparticles includes placing the substrate in a deposition chamber.

20. The method of claims 13 or 19 including monitoring nanoparticle deposition using a Faraday cup.

21. The method of claims 13 or 19 wherein the chamber includes a transparent portion for observing nanoparticle deposition.

22. The method of claims 1 or 13 wherein depositing nanoparticles includes placing the substrate in a gas flow which contains nanoparticles.

23. The method of claim 22 wherein the gas flow is in a first direction and an applied electric field is in a second direction.

24. The method of claim 23 wherein the first and second directions are perpendicular to each other.

25. The method of claim 13 wherein the stamp substrate comprises a semiconductor material and the top layer comprises a dielectric or insulating material.

* * * * *

UNITED STATES PATENT AND TRADEMARK OFFICE
CERTIFICATE OF CORRECTION

PATENT NO. : 7,232,771 B2
APPLICATION NO. : 10/982179
DATED : June 19, 2007
INVENTOR(S) : Jacobs et al.

It is certified that error appears in the above-identified patent and that said Letters Patent is hereby corrected as shown below:

Col. 11, line 43, change "claims" to --claim--.

Signed and Sealed this

Twentieth Day of November, 2007

JON W. DUDAS
*Director of the United States Patent and Trademark Office*